United States Patent
Ema et al.

[11] Patent Number: 5,550,395
[45] Date of Patent: Aug. 27, 1996

[54] SEMICONDUCTOR DEVICE AND PROCESS OF PRODUCING SAME

[75] Inventors: Taiji Ema; Toshimi Ikeda, both of Kawasaki, Japan

[73] Assignee: Fujitsu Limited, Kanagawa, Japan

[21] Appl. No.: 376,082

[22] Filed: Jan. 20, 1995

Related U.S. Application Data

[63] Continuation of Ser. No. 46,149, Apr. 15, 1993, abandoned.

[30] Foreign Application Priority Data

Apr. 16, 1992 [JP] Japan ..................................... 4-096726
Oct. 9, 1992 [JP] Japan ..................................... 4-271622

[51] Int. Cl.⁶ .......................... H01L 27/108; H01L 29/76; H01L 29/94; H01L 31/119
[52] U.S. Cl. ............................................. 257/306; 257/296
[58] Field of Search ...................................... 257/306, 296

[56] References Cited

U.S. PATENT DOCUMENTS

| | | | |
|---|---|---|---|
| 4,953,126 | 8/1990 | Ema | 257/306 |
| 5,091,761 | 2/1992 | Hiraiwa et al. | 257/306 |
| 5,126,810 | 6/1992 | Gotou | 257/306 |
| 5,153,685 | 10/1992 | Murata et al. | 257/296 |
| 5,196,910 | 3/1993 | Moriuchi et al. | 257/296 |
| 5,237,187 | 8/1993 | Suwanai et al. | 257/296 |
| 5,245,205 | 9/1993 | Higasitani et al. | 257/296 |

*Primary Examiner*—Stephen D. Meier
*Attorney, Agent, or Firm*—Nikaido, Marmelstein, Murray and Oram LLP

[57] ABSTRACT

A semiconductor device includes a semiconductor substrate having a memory cell area and a circuit area surrounding the memory cell area with a boundary area interposed therebetween. A first conductive layer covers the memory cell area and extends onto the boundary area. A first insulating layer covers the surrounding circuit area and part of the extended portion of the first conductive layer. A second insulating layer covers the first insulating layer and the first conductive layer. A throughhole is formed through the first and second insulating layers. A second conductive layer is electrically connected with another conductive layer via the throughhole and extends from the memory cell area to the surrounding circuit area. The process of producing the semiconductor device is also disclosed.

11 Claims, 18 Drawing Sheets

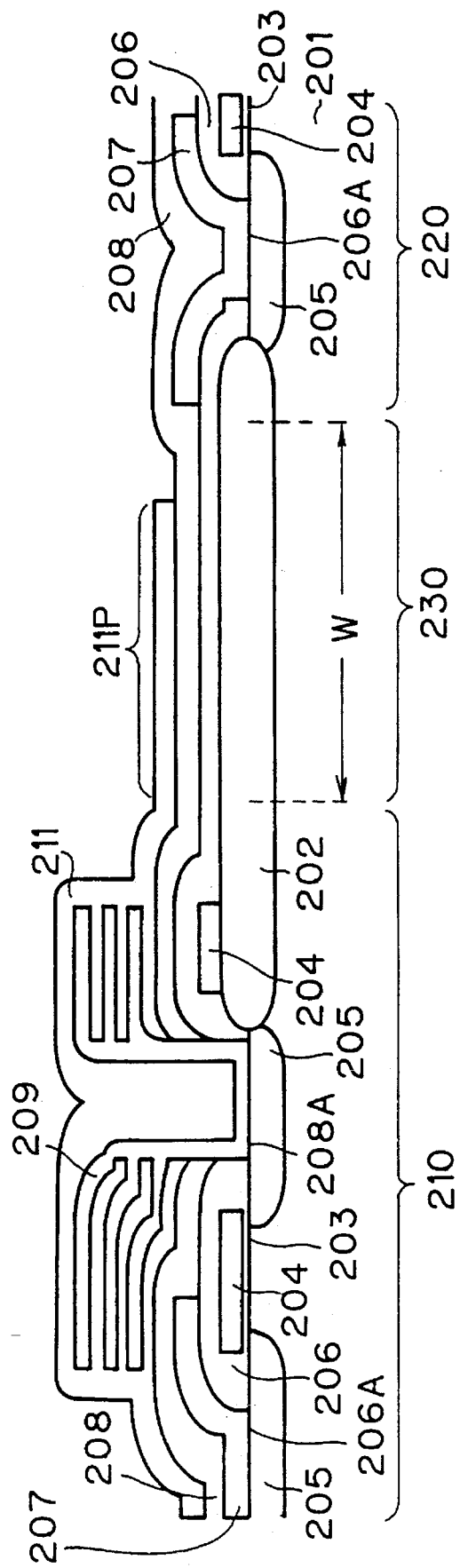

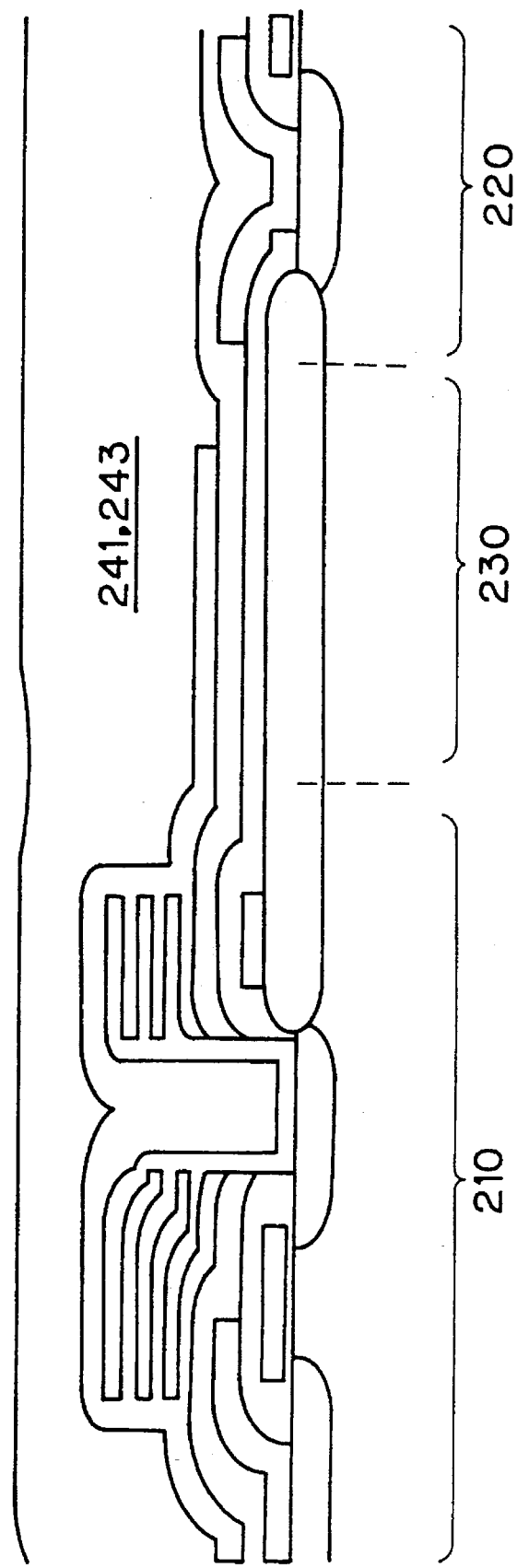

SEMICONDUCTOR DEVICE AND PROCESS OF PRODUCING SAME

This application is a continuation division of U.S. patent application Ser. No. 08/046,149 filed Apr. 15, 1993, abandoned.

BACKGROUND OF THE INVENTION

1. Field of the Invention

The present invention relates to semiconductor devices such as highly integrated DRAMs and SRAMs having a difference between heights of a memory cell and the surrounding circuits, and also relates to a process of producing such devices.

2. Description of the Related Art

Highly integrated DRAMs tend to have the capacitor electrode of a greater height to ensure a greater storage capacity. Capacitors are provided only in the memory cells but not in the surrounding circuit areas, causing an increase in the difference between heights of the memory cell area and the surrounding circuit area. The increased integration or refinement involves the narrowing of conductor wirings running above the memory cell area and the surrounding circuit area. This reduces the focus depth allowance upon exposure for forming the conductor pattern. The above-mentioned increase in the height difference further reduces the focus depth allowance.

This phenomenon is fully described in Japanese Patent Application No. 3-285088 by the same assignee, in which the present inventors proposed to design memory cells so as to be covered by the focus depth allowance of the exposing apparatus. This proposal, however, uses an ECC (error correction code) to suppress the natural α-rays soft error and the ECC unavoidably causes a drop in the working speed of the device.

An SRAM (static random access memory) cell composed of MOS transistors is expressed as an equivalent circuit as shown in FIG. 1, containing driving MOSFETs t11 and t12, loading MOSFETs t21 and t22, and transfer MOSFETs t31 and t32.

The driving MOSFETs t11 and t12 have channel regions formed in the bulk body of a semiconductor substrate and the loading MOSFETs t21 and t22 have channel regions formed in polycrystalline semiconductor layer on the semiconductor substrate.

FIG. 2A shows a sectional view of the MOSFETs in the portion enclosed by the broken line of FIG. 1.

An active region X surrounded and defined by a selectively oxidized layer 382 on a semiconductor substrate 381. The driving MOSFET t11 has a gate electrode 383 formed on the substrate 381 in the active region X with a gate insulating layer 384 interposed between the electrode 383 and the substrate 381. The gate electrode 383 has one end stepping over the selectively oxidized region 382 and connected to an impurity-doped region 385.

Above an insulating layer 386 covering the gate electrode 383, a lower gate electrode 387, a polycrystalline semiconductor layer 388 and an upper gate electrode 389 are formed to compose a loading MOSFET t22, with insulating layers 390 and 391 interposed between the lower electrode 387 and the semiconductor layer 388 and between the semiconductor layer 388 and the upper insulating layer 389, respectively.

The polycrystalline semiconductor layer 388 has a channel region with introduced impurities on the both sides thereof to define source/drain regions. The two gate electrodes (or double gates) 387 and 389 are connected to the source/drain regions of the loading MOSFET t21 located on the substrate 381.

A contact hole 392 is formed through the insulating layers 386, 390 and 391 and through the polycrystalline semiconductor layer 388, which are located on the gate electrode 383 stepping over the selectively oxidized layer 382. The contact hole 392 has a side wall and a bottom surface which are coated with a conductive layer 393 having a U-shaped section. This arrangement connects the gate electrode 383 of the driving MOSFET t11 to one of the source/drain regions of the loading MOSFET t22.

The impurity-doped region 385 defined in the active region X is connected to one end of the gate electrode 383 of the driving MOSFET t11 and is connected to one of source/drain regions 394 and 395 of the transfer MOSFET t31. Gate electrode 396 of the transfer MOSFET t31 is formed on the semiconductor substrate 381 with a gate insulating layer interposed therebetween.

An insulating layer 397 covers the SRAM area Y and the surrounding area Z.

As described above, the loading MOSFET t22 has two gate electrodes 387 and 389 and the semiconductor layer 388, which are formed on the semiconductor substrate 381, to form a multiple-layered structure, so that the SRAM cell area Y is higher than the surrounding circuit area Z to form a step of height "d".

To minimize the step height "d", a BPSG (borophosphosilicate glass) layer 397 is formed all over the substrate and is then heated to reflow, as shown in FIG. 2B.

This cannot provide sufficient flattening where the height of SRAMs tends to increase more and more. For example, the step height is not reduced sufficiently when a capacitor "Q" is formed on the loading MOSFET t22 in order to avoid α-rays soft errors, as shown in FIG. 3A.

The capacitor "Q" is formed by increasing the height of the space for the conductive layer 393 (FIG. 2A) which connects the gate electrode 383 of the driving MOSFET t11 to the source/drain regions of the loading MOSFET t22, forming in that space a storing electrode "SN" in the form of a fin, coating the electrode "SN" with a dielectric layer "DL" and forming a counter electrode "CP" on the layer "DL".

It is usually necessary to form contact holes simultaneously in both the SRAM cell area Y and surrounding circuit area z or to form wiring running over both areas Y and Z, by exposing a photoresist 398 as shown in FIG. 3B. The focus depth may be smaller than the height "d" of such a large step, causing degradation of the precision of patterning.

In "Semiconductor World", December 1991, p. 186, Oowada pointed out the importance of the reduction of the step height in the multiple layered wiring technology, particularly in logic ICs. This problem is common to the height difference between the memory cell and the surrounding circuit. It should be noted, however, that the height difference in logic ICs is caused by a random wiring, so that the distribution of height difference is more complicated than that in memory cells. Oowada did not suggest a solution therefor.

FIGS. 4A, 4B and 4C show a commonly known process for flattening of the wiring steps, as can be seen from "Solid State Technology, Nov. 1991, p. 67–71, for example.

Referring to FIG. 4A, a wiring 111 is formed on a substrate 110 and is then covered with an insulating layer 112. The insulating layer 112 stands out in the portion of a smaller spacing of the wiring 111 than in the portion of a greater spacing. A resist pattern 113 is then formed on the insulating layer 112 in the portion with a wiring spacing greater than a certain value.

Referring to FIG. 4B, etching of the insulating layer 112 is carried out by utilizing the resist 113 as a mask to reduce the height of insulating layer 112 in the portion with a smaller spacing of the wiring 111. This etching must be precisely controlled, because an excessive etching causes an abnormal step and an insufficient etching causes an incomplete flattening.

Referring to FIG. 4C, after the resist 113 is removed, an upper insulating layer 114 is formed to complete the flattening necessary for an overlying wiring layer to be formed.

The insulating layers 112 and 114 may be far more effective when formed of composite SOG (spin-on-glass) /CVD-oxide layers than when formed of a CVD-oxide layer alone.

Another process are known, in which a complete flattening of the wiring steps is effected by the combined use of a special polymer or film and an etching back technique, as is proposed by Numazawa et al. in the proceedings of "SEMI technology symposium", p. 245–255 and by D. Wang et al., ibid, p. 257–265.

The above-recited conventional technologies, however, were intended to cover all the steps caused by a random wiring and having a complicated pattern, in which the following substantial problems remain:

1) A high precision etching technique is necessary;

2) The use of a special polymer is not only a disadvantage in itself but also necessitates etching control to avoid leaving remains of such a polymer; and 3) An etching control for simultaneously etching-back layers of different materials is necessary.

A further disadvantage is that the heat treatment temperature is rigidly limited because the wiring is formed of aluminum or other materials having a low melting point.

As described above, the complete flattening of the wiring is a very difficult technological problem and is still under development, i.e., it is not applicable to memory devices and the like in practice.

SUMMARY OF THE INVENTION

The object of the present invention is to provide a semiconductor device, such as DRAMs and SRAMs, and a process for producing the same, in which flattening is sufficiently carried out for allowing a high precision patterning of wiring running above the memory cell area and the surrounding circuit area even when there is a large step between these areas.

To achieve the object according to the first aspect of the present invention, there is provided a semiconductor device comprising:

a semiconductor substrate having a memory cell area and a circuit area surrounding the memory cell area with a boundary area interposed therebetween;

a first conductive layer covering the memory cell area and extending onto the boundary area;

a first insulating layer covering the surrounding circuit area and part of the extended portion of the first conductive layer;

a second insulating layer covering the first insulating layer and the first conductive layer;

a throughhole formed through the first and second insulating layers; and a second conductive layer electrically connected with another conductive layer via the throughhole and extending from the memory cell area to the surrounding circuit area.

According to the second aspect of the present invention, there is also provided a process of producing a semiconductor device, the process comprising the steps of:

defining a first area and a second area with a boundary area therebetween on a semiconductor substrate;

forming a first electronic element on the first and second areas;

forming a second electronic element only on the first layer;

forming a first conductive layer extending from the first area to the boundary area;

forming a first insulating layer entirely on the substrate;

removing the portion of the first insulating layer that covers the first area, and thereby, exposing the first conductive layer;

forming a second insulating layer entirely on the substrate;

selectively removing the first and second insulating layers to form a throughhole; and forming a second conductive layer extending from the first area to the second area.

During etching for removing the first insulating layer and thereby exposing the first conductive layer, termination of the etching is detected by the first conductive layer.

A boundary area is provided between a memory cell area and a surrounding circuit area on a semiconductor substrate; a first conductive layer covers the memory cell area totally and the boundary area; and a first insulating layer covers the portion of the first conductive layer that is located on the boundary layer partially and the surrounding circuit area totally. Thus, the first conductive layer resides in the surrounding circuit area and the portion of the boundary area that adjoins to the surrounding circuit area, but does not reside in the memory cell area or the portion of the boundary area that adjoins to the memory cell area. This arrangement increases the height of the area on the substrate that surrounds the memory cell area by an increment corresponding to the thickness of the first insulating layer so as to cancel or offset the difference in height between the memory cell area and the surrounding circuit area. Thus, the first insulating layer has a thickness in accordance with the height of the electronic element such as a capacitor formed in the memory cell area.

The second insulating layer is provided to cover the first insulating layer and the portion of the first conductive layer that is not covered by the first insulating layer, so as to cancel or offset the step due to the memory cell height, thereby achieving a desired flattening.

Before forming the second insulating layer, the portion of the boundary area that adjoins to the memory cell area is concave with respect to the surrounding region, because neither the first insulating layer nor an electronic element such as a capacitor is formed in this portion. The size of the boundary area should be determined so that the concavity is fully filled with the material of the second insulating layer.

Typically, the memory cell is composed of a transfer transistor and a capacitor.

The process according to the second aspect of the present invention defines, on a semiconductor substrate, a first area, a second area and a boundary area between the former two, forms a first electronic element in the first and second areas, and forms a second electronic element only in the first area. Typically, the first electronic element is an element with a small height such as a MOS transistor and the second electronic element is an element with a greater height such as a capacitor.

The first conductive layer extends from the first area to the boundary area. Typically, the first conductive layer is formed as one electrode of a capacitor.

After forming the first insulating layer covering entirely the substrate area, the portion of the first insulating layer that covers the first area is removed to expose the underlying first conductive layer. In this process step, termination control of the etching for removing the first insulating layer is easily effected by the first conductive layer and no complicated control of the etching is required. This provides one of the most significant advantages according to the present invention.

Preferably, a third insulating layer having etching properties different from that of the first insulating layer is deposited on the first conductive layer. The material of the third insulating layer is selected so that undesired substances do not diffuse into the first insulating layer during heating for reflowing of the first and second insulating layers. This arrangement enables detection of etching termination to be easily effected by the third insulating layer formed on the first conductive layer during the process step of exposing the first conductive layer by the removal of the first insulating layer. The third insulating layer also acts as a protective film for preventing possible diffusion of any undesired substances from the first and/or second insulating layers to the first conductive layer during heating for reflowing the first and second insulating layers.

Typically, the first conductive layer is fabricated by sequentially depositing a polysilicon layer and a silicon nitride layer in that order; the first and second insulating layers are formed by forming silicon oxide layers containing impurities; the portion of the first insulating layer that covers the first area is removed by etching with a solution containing hydrofluoric acid to expose the first conductive layer; the first and second insulating layers are reflowed by a heat-treatment carried out after forming of the second insulating layer.

Memory devices are relatively simple in pattern such that substantial height differences only occur between the memory cell area and the surrounding circuit area, and moreover, the heat treatment temperature is not rigidly limited because the reflow process is carried out prior to the provision of wiring. The present invention takes advantage of this fact to solve the problem of flattening for wiring.

According to a preferred embodiment of the present invention, a memory cell area and surrounding circuit area with a boundary area interposed therebetween are first defined on a semiconductor substrate, a conductive layer pattern covering the memory cell area and extending to the boundary area is then formed, a first BPSG layer, for example, is formed entirely over the substrate and is then removed in the portion from the boundary area to the memory cell area, a second BPSG layer, for example, is formed all over the substrate, and both BPSG layers are reflowed by heat treatment.

The etching for removal of the first formed BPSG layer is very easily controlled because of the presence of the underlying conductive layer pattern, i.e., the etching is simply allowed to continue until the conductive layer is exposed.

This formation and etching of a BPSG layer easily flattens local unevenness and flattening all over the substrate is achieved without using SOG or other special materials.

According to the third aspect of the present invention, there is provided a semiconductor device, such as that shown in FIGS. 7A to 7K, comprising:

a semiconductor substrate 301;

a memory cell area "A" and a surrounding area "B" having the uppermost surface located on a level lower than that of the memory cell area;

a band pattern layer 326 located on a level lower than the uppermost surface of the memory cell area "A" and disposed on a boundary area "C" provided between the memory cell area "A" and the surrounding area "B";

a first insulating layer 328 formed on the uppermost surface of the surrounding area "B" and covering the periphery of the boundary area "C"; and a second insulating layer 331 entirely covering the first insulating layer 328, the memory cell area and the boundary area "C".

Preferably, the band pattern layer 326 is composed of polysilicon or silicon nitride; and the first and second insulating layers 328, 331 are composed of a silicon oxide layer containing impurities.

Typically, the memory cell area "A" includes a pattern of conductive layers 304, 308, 310, 311 and 312 composed of a plurality of layers; and the surrounding area "B" includes a pattern of conductive layers 322 less in number than that of the memory cell area "A".

According to the fourth aspect of the present invention, there is provided a process of producing a semiconductor device, the process comprising the steps of:

forming a memory cell in a first area "A" of a semiconductor substrate 301 and a surrounding circuit 319 in a second area "B" of the semiconductor substrate, the latter having a height smaller than the memory cell (FIGS. 7A, 7B);

growing an etching stopper layer 326 entirely on the substrate 301 (FIG. 7C), and thereafter, selectively removing the portion of the etching stopper layer 326 that covers the surrounding circuit 319 (FIGS. 7C, 7A, 7B);

growing a first insulating layer 328 entirely on the substrate 301, and thereafter, forming on the first insulating layer 328 a mask 329 having a pattern overlapping the surrounding circuit 319 and the periphery of the etching stopper layer 326 (FIG. 7D);

etch-removing the portion of the first insulating layer 328 that is exposed through the mask pattern 329, and thereby, exposing the etching stopper layer 326 in the first area "A" (FIG. 7E);

selectively removing the portion of the etching stopper layer 326 that is not overlapped by the mask pattern 329 but is exposed (FIG. 7F); and exfoliating the mask 329 (FIG. 7G), and thereafter, depositing a second insulating layer 331 entirely on the substrate (FIG. 7H).

Typically, the etching stopper layer 326 is composed of polysilicon or silicon nitride: the first and second insulating layers 328, 331 are composed of a silicon oxide layer containing impurities.

According to the third and fourth aspects of the present invention, the first insulating layer 328 is provided only on the surrounding circuit 319 less in height than the memory cell; and the second insulating layer 331 is provided on the first insulating layer 328 and the memory cell. Thus, the surrounding circuit area "B" is imparted with an additional height by the first insulating layer 328 to substantially cancel the height difference with the memory cell. Moreover, as the second insulating layer 331 is provided both on the memory cell area "A" and on the surrounding circuit area "B" to flatten these areas, so that a resist layer applied on the second insulating layer 331 can have a uniform thickness.

This provides an improved precision of the patterns formed over both areas "A" and "B" and in contact with the underlying layer, by eliminating the conventional problem of focus depth during exposure for forming such patterns.

The etching stopper layer 326 consequently remains only in the boundary area "C" and in the form of a band, but not in throughholes in the surrounding circuit 319, thereby avoiding the shape defect which would otherwise occur when an etching stopper layer extrudes inside the throughholes.

During removal or etching of the first insulating layer 328 in the memory cell area "A", the etching stopper layer 326 provided in the memory cell area "A" protects the underlying layers from being undesirably removed.

BRIEF DESCRIPTION OF THE DRAWINGS

FIGS. 5A to 5F show a process sequence according to the first and second aspects of the present invention, in sectional view;

DESCRIPTION OF THE PREFERRED EMBODIMENTS

Example 1

Figure 1:
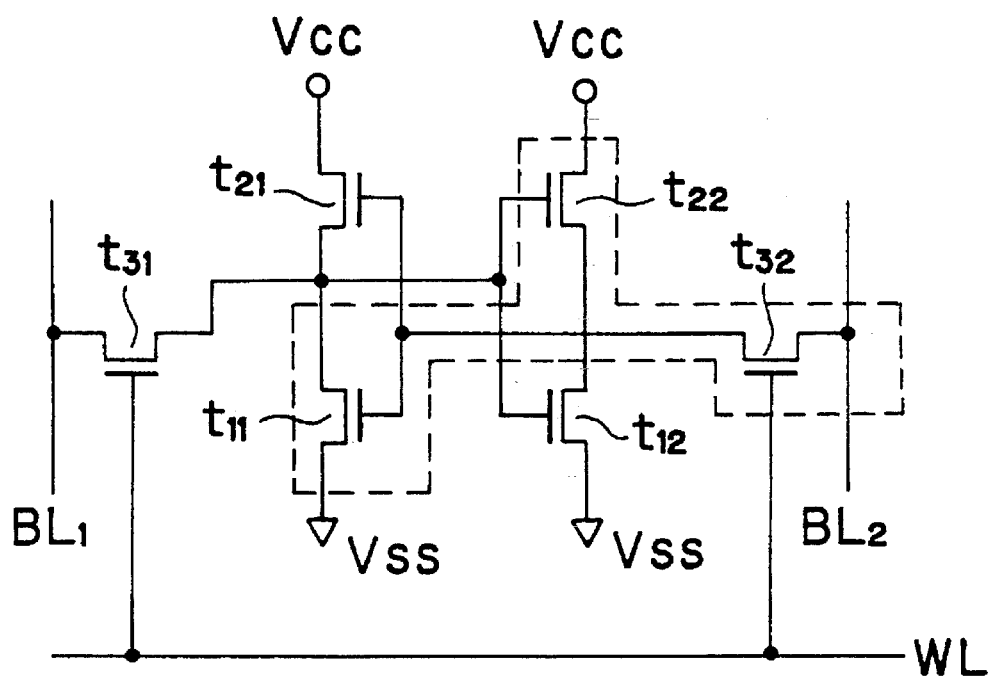
FIG. 1 shows an equivalent circuit corresponding to an SRAM.
Figure 2A:
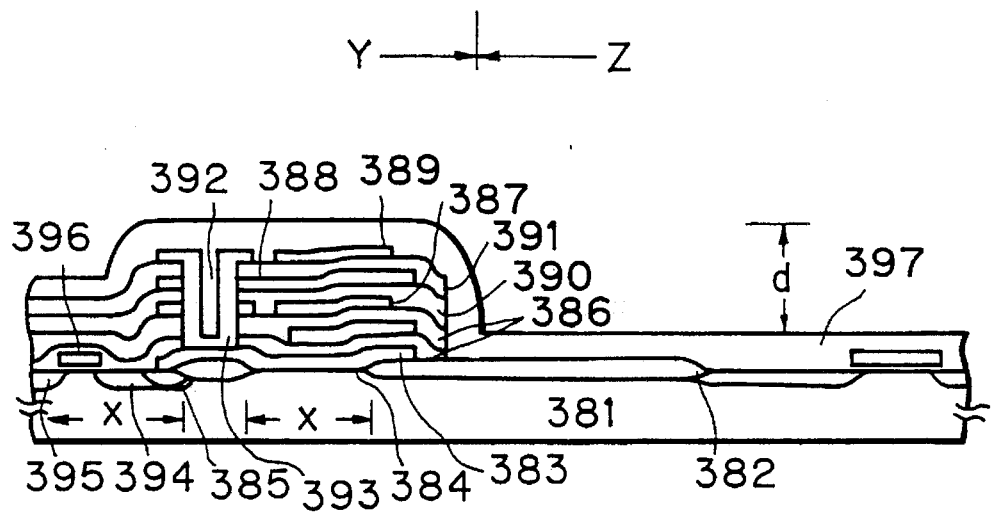
FIGS. 2A and 2B show a conventional arrangement of MOSFETs, in sectional view.
Figure 2B:
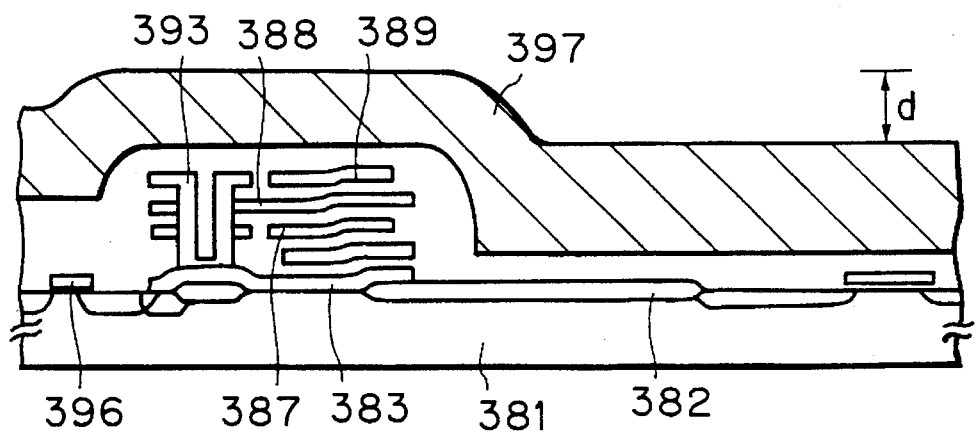

According to the first and second aspects of the present invention, a semiconductor device including a DRAM cell was produced through the following steps as shown in FIGS. 5A to 5F.

Step 1 (FIG. 5A)

A DRAM cell 210, having a fin-type capacitor, and a surrounding circuit 220 were formed on a silicon substrate 201 in a manner common to conventional semiconductor processes, except that a counter electrode pattern 211 of the cell 210 was formed so as to extend to a boundary area 230 provided between the areas 210 and 220. The boundary area 230 had a thickness (W) of 10 μm.

The structure shown in FIG. 5A has the following arrangement.

A field oxide layer 202 for isolation of elements is provided on the surface of a p-type silicon semiconductor substrate 201. A gate oxide layer 203 is formed in the active region defined by the field oxide layer 202. A gate electrode 204, composed of a first layer of polysilicon, extends from the gate oxide layer 203 to the field oxide layer 202. The gate electrode 204 functions, in the memory cell area, as the gate electrode and lead of a transfer transistor in a memory cell, and in the surrounding circuit area 220, as the gate electrode of a MOSFET.

N-type diffusion layers 205 are formed by using the gate electrode 204 and the field oxide layer 202 as a mask to provide the source/drain regions of a MOSFET of the surrounding circuit and a transfer transistor of the memory cell.

A second polysilicon layer 207 has an electrical contact with the n-type diffusion layers 205 through contact holes 206A formed in an insulating layer 206 which covers the gate electrode 204 and the n-type diffusion layers 205. The second polysilicon layer 207 forms a bit line in the memory cell area 210, and in the surrounding circuit area 220, forms a pad layer, which will be described in detail later.

A fin-type storage capacitor electrode 209 is connected to the drain 205 of the transfer transistor in the memory cell through a contact hole 208A formed in an insulating layer 208 composed of laminated $SiO_2$/SiN layers and covering the second polysilicon layer 207. The storage capacitor electrode 209 is formed within the memory cell area 210 only. A counter electrode 211 is formed so as to cover a dielectric layer (not shown) which covers the storage capacitor electrode 209.

The gate electrode 204 was 1000Å thick, the bit line was 1000Å, the storage capacitor electrode was 3000Å high in total (i.e., 500Å thick fins triplicated with 500Å spacings interposed), and the counter electrode was 800Å thick. There was thus a height difference of about 5800Å between the outermost or top surface of the memory cell area 210 and the lowest portion of the surrounding circuit area 220, in which no substantial patterns are formed.

In the following FIGS. 5B to 6B, reference numerals 202 to 209 are omitted for simplicity, as these numerals denote component members having no essential relationship with the present invention. These numerals can be seen in FIG. 5A.

Figure 5B:
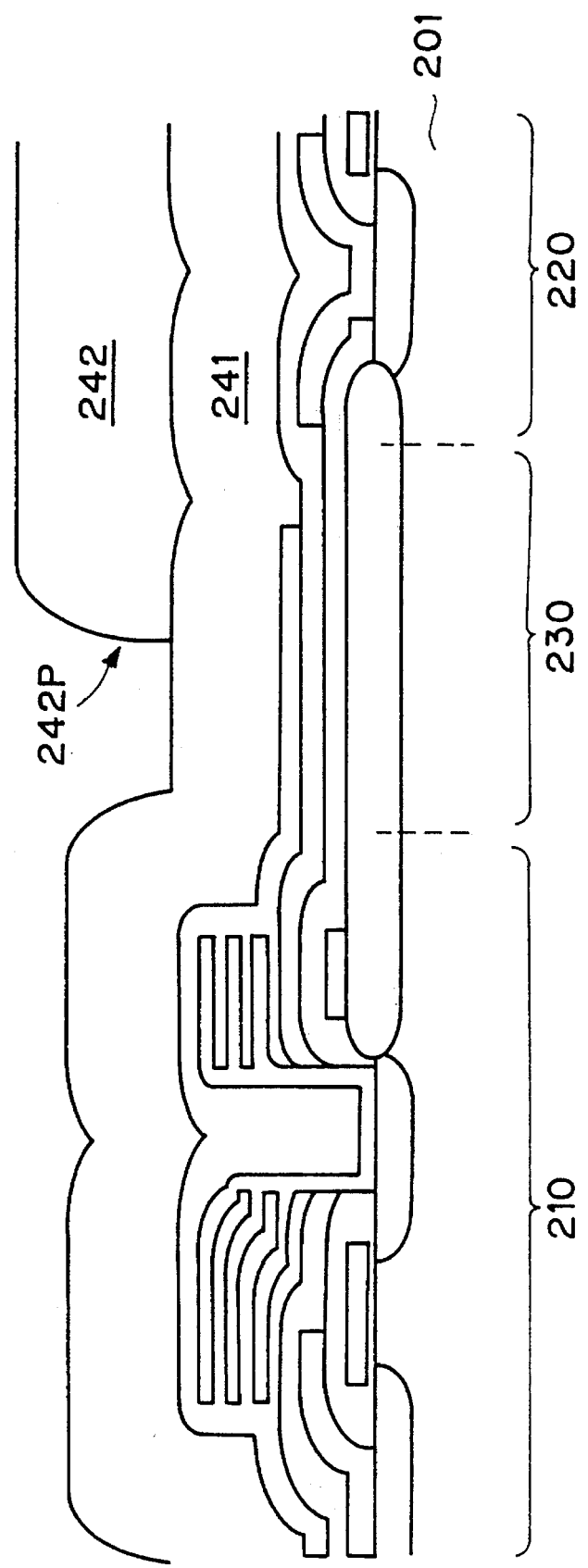

Step 2 (FIG. 5B)

A CVD process was performed to form a BPSG layer 241 with a thickness corresponding to the height difference between the memory cell area 210 and the surrounding circuit area 220, i.e., 5800Å in this example. A photolithography process was then performed to form a resist pattern covering the surrounding circuit area entirely and the boundary area 230 partially, in such a manner that the resist pattern 242 has an end 242P located within the boundary area 230 and above the extended portion 211P of the counter electrode 211.

Figure 5C:
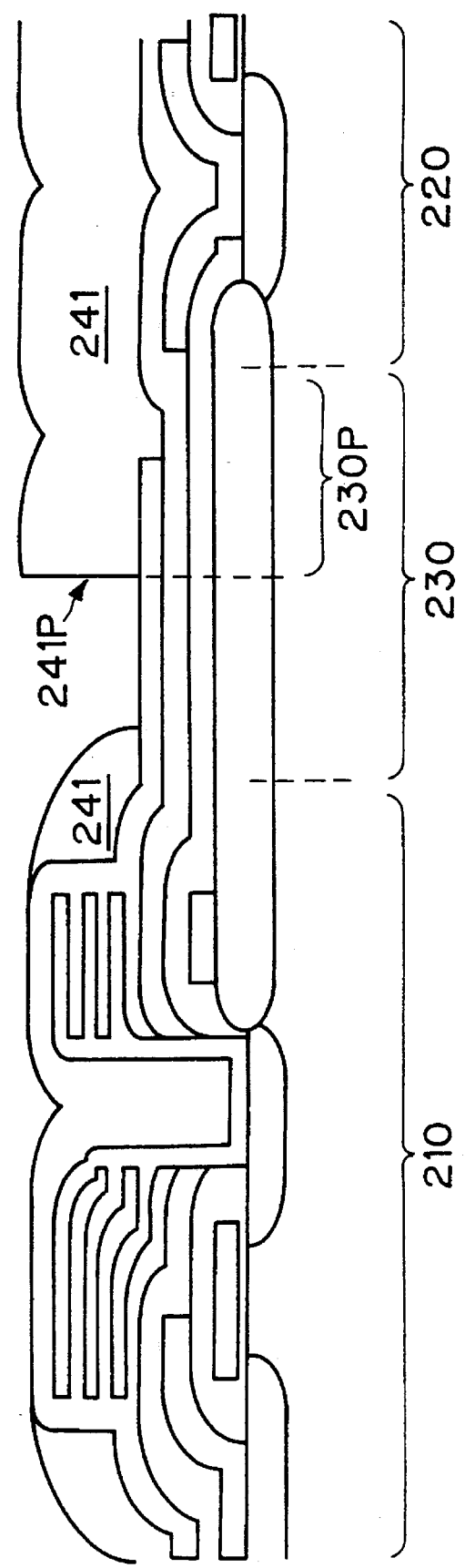

Step 3 (FIG. 5C)

The BPSG layer 241 was unisotropically etched by a $CHF_3$/He mixed gas by using the resist 242 as a mask, followed by removal of the resist 242. The BPSG layer 241 was thus patterned so as to cover the surrounding circuit area 220 and the portion 230P of the boundary area 230 that adjoins to the surrounding circuit area 220. Isotropic etching processes using HF (hydrofluoric acid) solutions, for example, may be used instead of the herein-used unisotropic etching. In either type of etching, termination of etching is easily controlled, because etching is automatically terminated at the extended portion 211P of the counter electrode 211 which is composed of polysilicon, for example.

When an RIE (reactive ion etching) is used, the termination of etching is advantageously detected by an emission spectrum of the plasma used, which changes upon exposure of the counter electrode 211. Such a detection is possible, as the counter electrode 211 covers entirely the memory cell 210 and occupies a large proportion of the substrate area.

The boundary area 230 can be sufficiently large so as to allow isotropic etching, for example, by HF to be carried out. In this case, the counter electrode 211 of polysilicon, for example, is not substantially etched by isotropic etching, and therefore, an excessive etching time would cause no problem.

Thus, it is a remarkable advantage of the present invention that etching termination can be controlled far more easily than in conventional flattening processes.

Figure 5D:
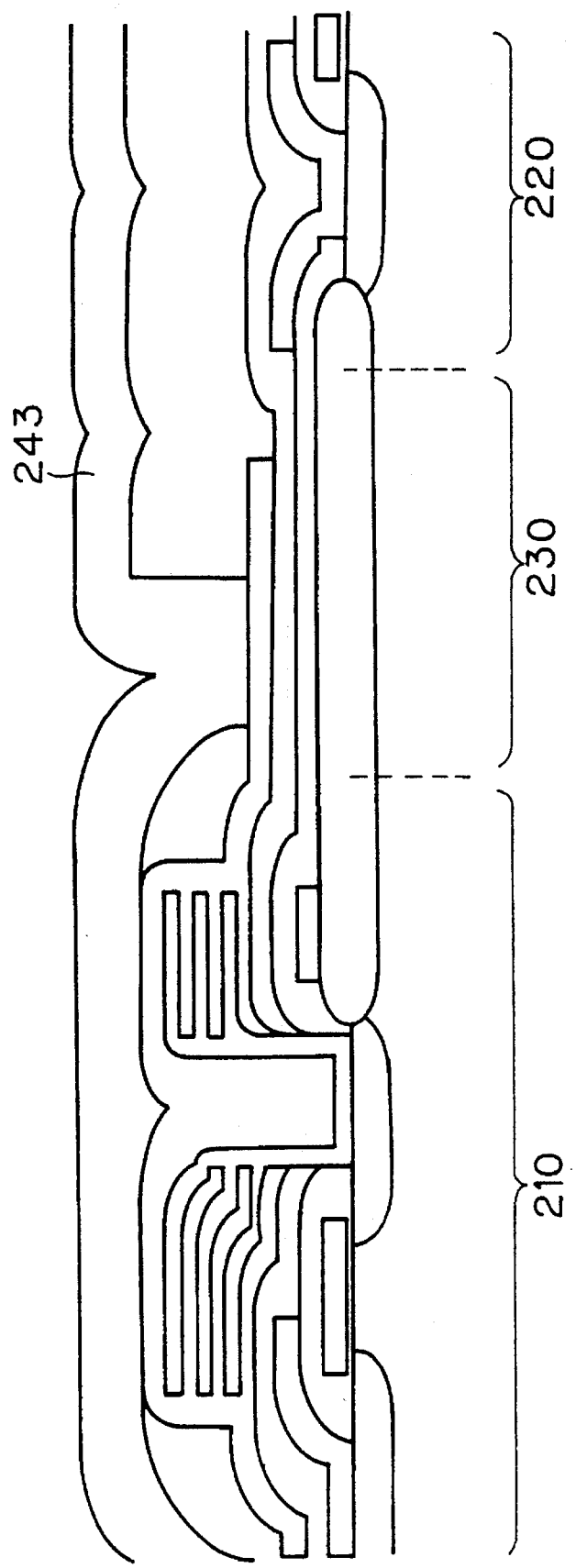

Step 4 (FIG. 5D)

A CVD process was performed to grow another BPSG layer 243 as thick as required to fill up the gap between the end 241P of the BPSG layer 241 and the memory cell 210, specifically 2500Å in this example. However, it is not essential to fill the gap in this step, because a reflow process will be carried out in the next step.

Step 5 (FIG. 5E)

A heat treatment was carried out at 850° C. for 20 min in a nitrogen gas atmosphere to reflow the BPSG layers 241 and 242, with the result that the substantial height difference between the memory cell 210 and the surrounding circuit 220 was eliminated, although a minute local unevenness remained. Such a minute unevenness can be flattened by selecting a suitable reflow condition.

Thus, because the reflow process can be adopted in the present invention, sufficient flattening is achieved by using BPSG or other common materials without using special materials such as SOG, and consequently, a stable manufacture of devices can be realized. This is also a remarkable advantage of the present invention over conventional flattening processes.

Figure 5F:
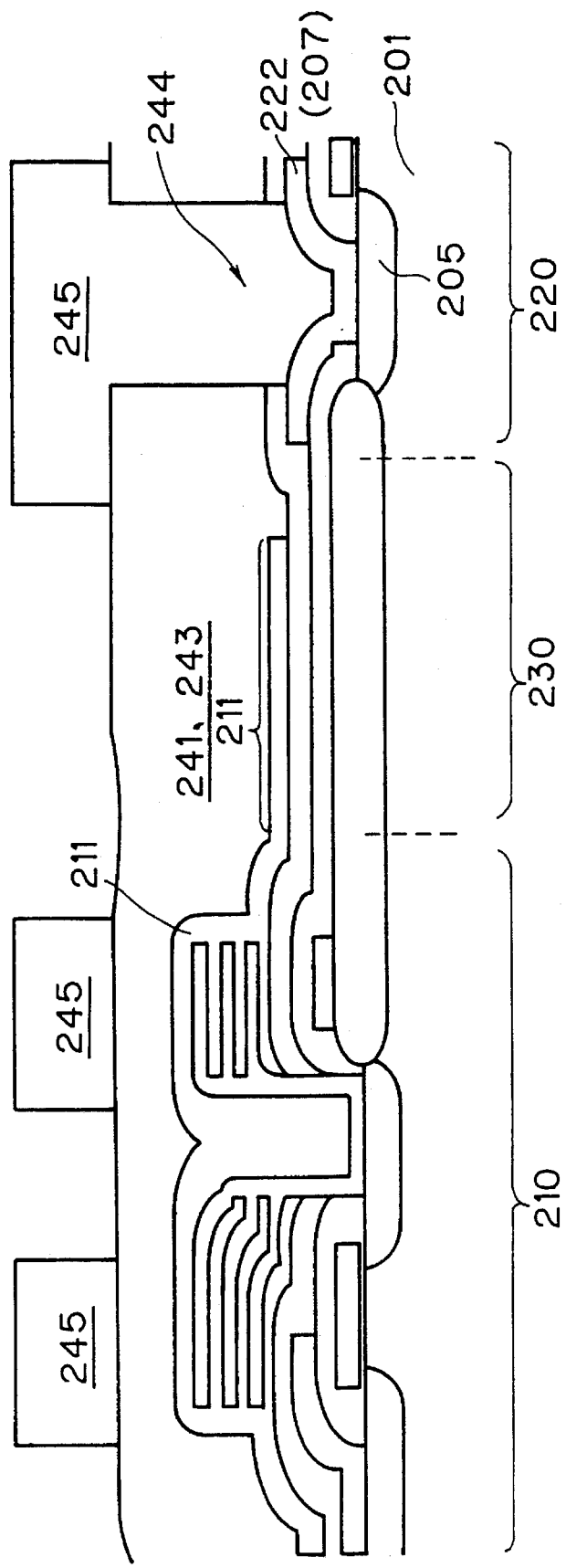

Step 6 (FIG. 5F)

A lithography process was performed to form a throughhole 244 for providing an electrical connection to the overlying wiring. The throughhole 244 is usually formed in the surrounding circuit through a thick BPSG layer, and therefore, has a large depth, as shown in FIG. 5F. Considering this fact, a pad 222 of the same material as that of the overlying bit wiring is provided at the site where the diffusion region 205 meets the bit wiring material in the throughhole 244. Such a pad is fully described in Japanese Unexamined Patent Publication (Kokai) No. 1-120863. This pad is advantageous in that relatively large throughholes can be used and that any small change in the throughhole shape does not cause a short circuit to the neighboring gate electrodes.

A CVD process was then performed to sequentially deposit Ti, TiN, and W layers, thereby burying the throughhole 244, followed by a lithography process to pattern wiring 245. This patterning of the wiring 245 is performed over a flat surface without substantial unevenness to achieve an extremely high precision, eliminating the conventional problem of the focus depth allowance.

Example 2

A semiconductor device having a DRAM cell was produced according to the present invention in the same process sequence as Example 1, except for the following modifications.

Figure 6A:
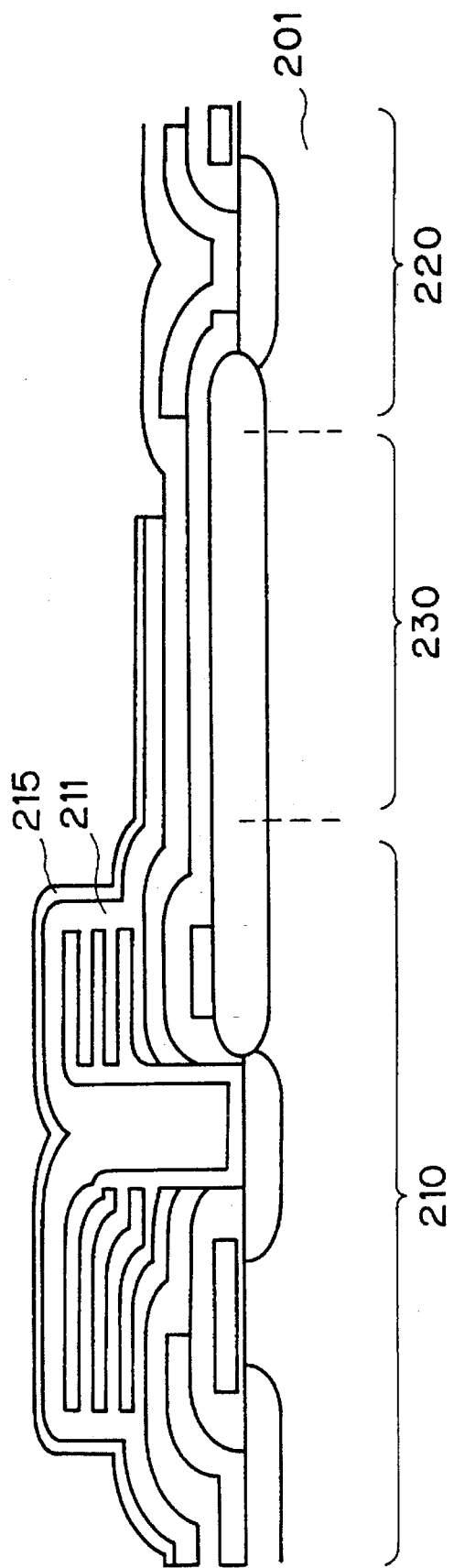
FIGS. 6A and 6B show another process sequence according to the first and second aspects of the present invention, in sectional view.

Step 1 (FIG. 6A)

Operations were performed in the same manner as in Example 1, except that a counter electrode 211 of polysilicon is coated with a silicon nitride layer 215 to form a laminate structure.

Figure 6B:
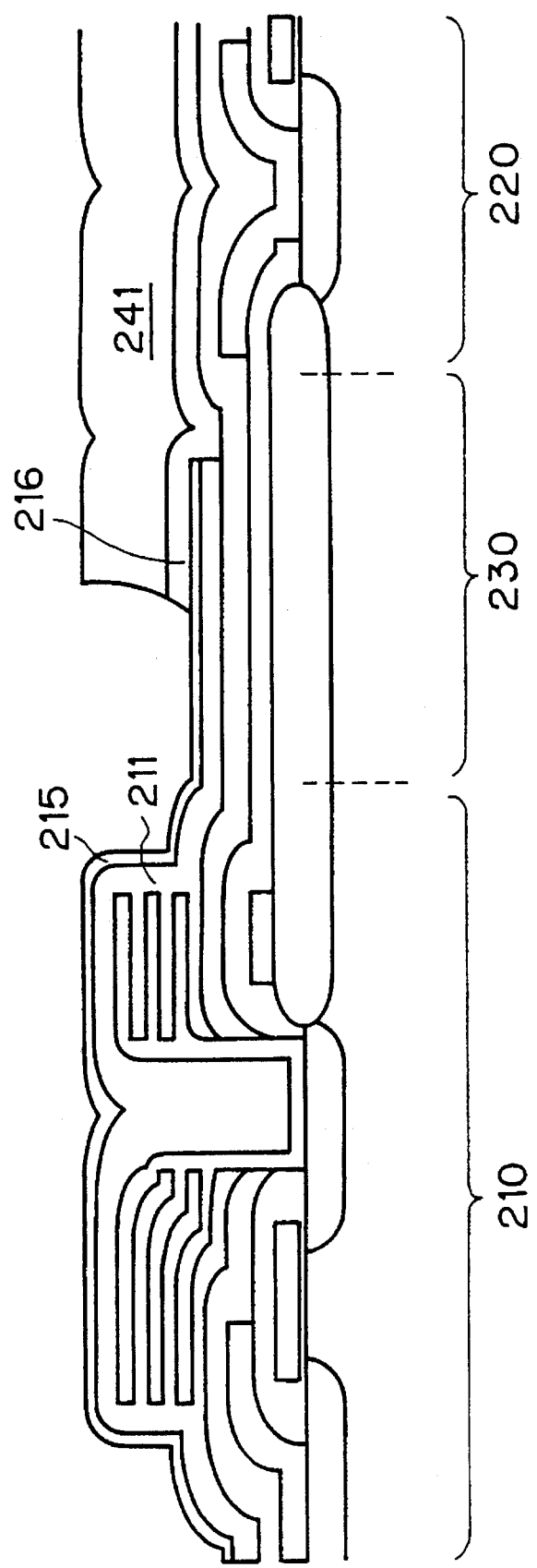

Step 2 (FIG. 6B)

A silicon oxide layer 216 was formed entirely over the substrate, followed by a CVD process as used in Example 1 to grow, on the layer 216, a BPSG layer 241 with a thickness corresponding to the height difference between the memory cell area 210 and the surrounding circuit area 220, i.e., 5800Å. A photolithography process was performed to form a resist pattern 242 covering the surrounding circuit area 220 entirely and the boundary area 230 partially, in such a manner that the end 242P of the resist pattern 242 that is located within the boundary area 230 is located above the extended portion 211P of the counter electrode 211.

By using the resist as a mask, the BPSG layer 241 and the silicon oxide layer 216 were isotropically etched with an HF solution and the resist 242 was then removed. This patterned the BPSG layer 241 so as to cover the surrounding circuit area 220 and the portion 230P of the boundary area 230 that adjoins to the surrounding circuit area 220. During this etching operation, the silicon nitride layer 215 acted as an etching stopper so that the polysilicon layer 211 was not exposed.

Then, operations were performed in the same manner as used in Example 1 including the steps of flattening, forming throughholes, and forming wirings.

In this example, the polysilicon layer 211 is covered with the silicon nitride layer 215 and is therefore not brought into direct contact with the overlying BPSG layers 241 and 243. This prevents the component elements such as B or P of these BPSG layers from diffusing into the polysilicon layer 211 during the heat treatment for the reflow process. The impurity concentration of the counter electrode significantly affects the resistivity and crystal grain growth thereof, i.e., variation in the impurity concentration causes significant variation in these properties. This is fully described in Japanese Unexamined Patent Publication (Kokai) No. 1-186655. The embodiment of this example effectively prevents such an undesired phenomenon by a simple measure.

Regarding diffusion of impurities, the present invention is also advantageous in the following points.

In the present invention, a first BPSG pattern is not provided on the counter electrode. Under such a condition, an excessive etching would expose the silicon substrate 201 in the transistor region, causing destruction of the transistor because of the diffusion of impurities from BPSG. The flattening effected by a reflow process according to the present invention is also very effective to avoid such a dangerous phenomenon.

Example 3

An embodiment according to the third and fourth aspects of the present invention is described.

FIGS. 7A to 7K are sectional views of an SRAM cell of FIG. 1 in the portion surrounded by the broken line containing MOSFETS and the surrounding circuit.

Figure 7A:
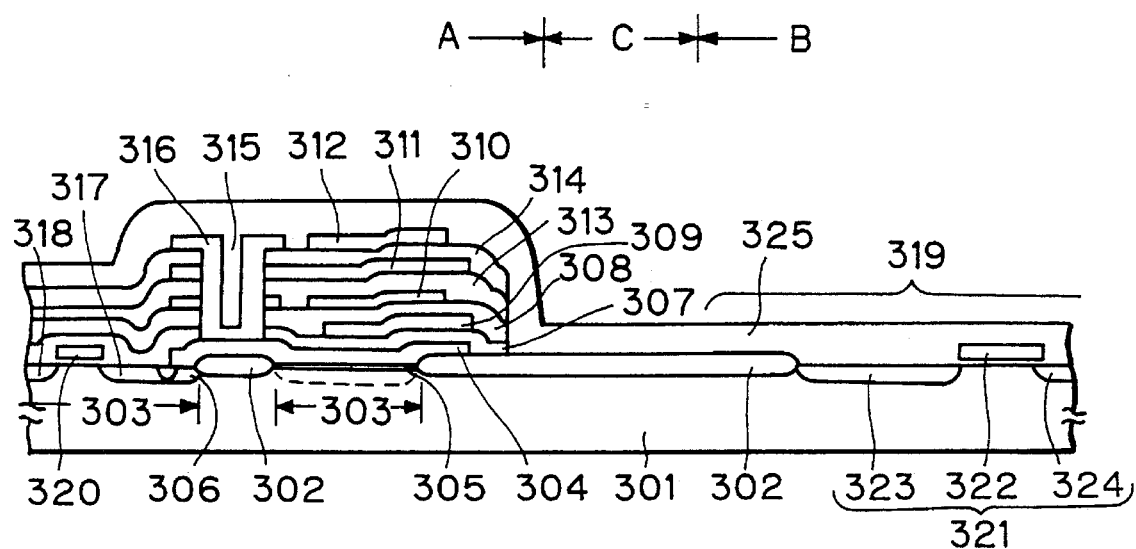
FIGS. 7A to 7K show a process sequence according to the third and fourth aspects of the present invention, in sectional view.

Step 1 (FIG. 7A)

In FIG. 7A, a silicon semiconductor substrate 301 has a memory cell area "A" containing a plurality of active regions 303 separated with a selectively oxidized layer 302 and has a surrounding circuit area "B" surrounding the memory cell area "A".

A driving MOSFET t11 and a transfer MOSFET t31 of the SRAM, both shown in FIG. 1, are formed in the active region 303 of the memory cell area "A".

A gate electrode 304 of the driving MOSFET t11 is formed on the semiconductor substrate 301 in the active region 303, with a gate insulating layer 305 interposed between the electrode 304 and the substrate surface. One end of the gate electrode 304 stepping over the selectively oxidized layer 302 is connected to the n-type impurity-doped layer 306 of the neighboring active layer 303. Not-shown n-type source/drain regions are formed in the active regions 303 located on both sides of the gate electrode 304.

Formed on an $SiO_2$ layer 307 covering the gate electrode 304 of the driving MOSFET t11 is a grounding conductor 308, on which a loading MOSFET t22 is formed with an $SiO_2$ layer 309 interposed between the MOSFET t22 and the conductor 308.

The loading MOSFET t22 is composed of a lower gate electrode 310, a polysilicon layer 311 and an upper gate electrode 312 with insulating layers 313 and 314 interposed therebetween. On the polysilicon layer 311, p-type source/drain regions and a channel region are provided.

Two gate electrodes (double gate) 310 and 312 are connected to p-type source/drain regions (not shown) of another loading MOSFET t21 of a similar structure.

A contact hole 315 is formed through $SiO_2$ layers 307, 309, 313 and 314 and the polysilicon layer 311, which are located above the gate electrode 304 of the driving MOSFET t11 stepping over the selectively oxidized layer 302 between the active layers 303, and inside the contact hole 315, a conductive layer 316 with a U-shaped section is formed on the side wall and bottom of the contact hole 315, so that the gate electrode 304 of the driving MOSFET t11 is connected to the polysilicon layer 311 which forms the source/drain regions of the loading MOSFET t22.

An impurity-introduced layer 306 of the active layer 303 connected to the leading edge of the gate electrode 304 of the driving MOSFET t11 is connected to one of the n-type source/drain regions 317 and 318 of the MOSFET t32 acting as a transmitter.

The above-described laminate structure composes part of an SRAM and a surrounding circuit 319, partially shown, is formed around the memory cell area "A".

The transfer MOSFET t32 has a gate electrode 320 formed on the substrate 301 with a gate insulating layer interposed therebetween. A MOSFET 321 has a gate electrode 322 and source/drain regions 323 and 324, which are formed in the surrounding are "B" of the substrate 301.

After the upper gate electrode 312 of the loading MOSFET t22 is formed, the subsequent process steps are carried out in the following manner.

A 100 nm thick $SiO_2$ layer 325 is formed by a CVD process entirely on the substrate to cover the memory cell area "A" and the surrounding circuit 319.

Figure 7B:
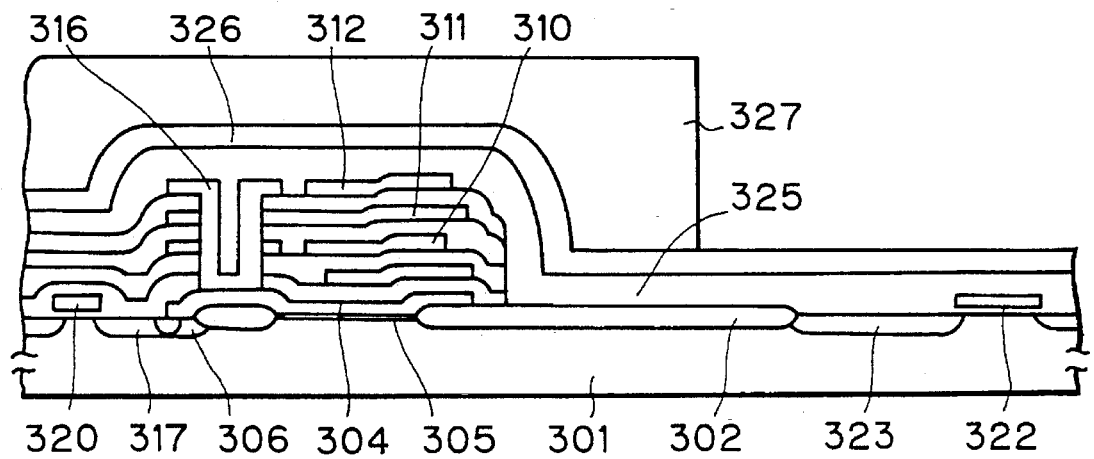

Step 2 (FIG. 7B)

Referring to FIG. 7B, a 100 nm thick polysilicon layer 326 is formed by a CVD process, and on the layer 326, a resist layer 327 is then applied, exposed to light and developed to form a resist pattern only covering the memory cell area "A" and the boundary area "C".

Figure 7C:
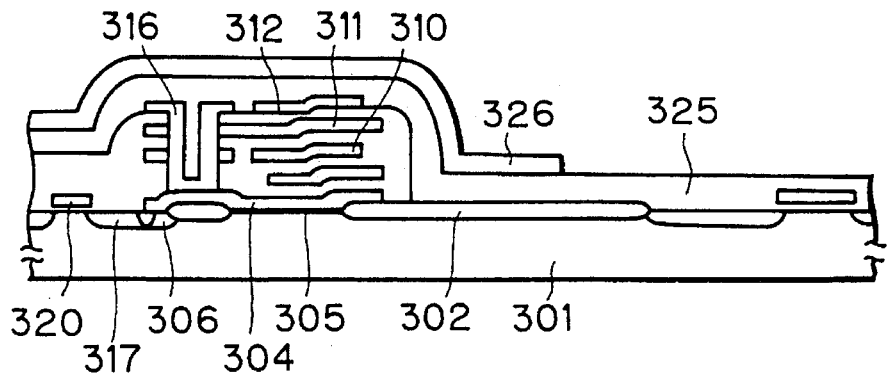

Step 3 (FIG. 7C)

A plasma etching is performed by using a $CF_4/O_2$ gas mixture to selectively remove the portion of the polysilicon layer 326 that is exposed from the resist 327. The resist 327 is then exfoliated. The resulting arrangement is shown in FIG. 7C.

Figure 7D:
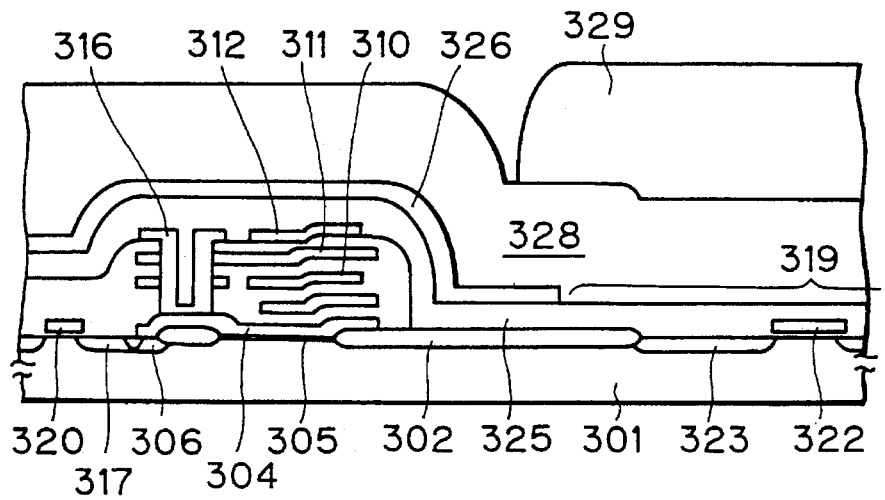

Step 4 (FIG. 7D)

Referring to FIG. 7D, a CVD process is carried out to form a BPSG (borophosphosilicate glass) layer 328 entirely over the substrate. The thus-formed BPSG layer 328 has a thickness corresponding to the height difference between the memory cell area "A" and the $SiO_2$ layer 325 covering the surrounding circuit 319, for example 500 nm.

A resist 329 is applied on the BPSG layer 328, exposed to light and developed to form a resist pattern covering the region of the BPSG layer 328 that is located above the surrounding circuit 319 and the circumferential portion of the polysilicon layer 326.

Figure 7E:
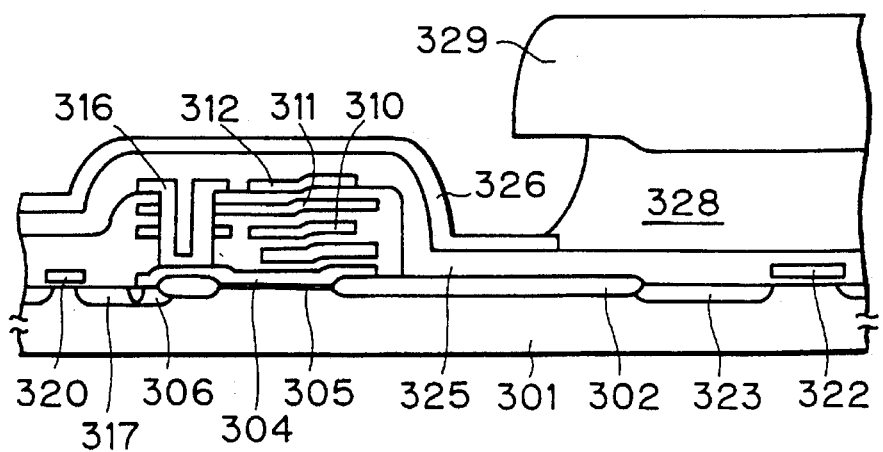

Step 5 (FIG. 7E).

Referring to FIG. 7E, the portion of the BPSG layer 328 that is exposed from the resist pattern 329 is removed by etching with hydrofluoric acid or the like. During this etching, the portion of the polysilicon layer 326 that is located in the memory cell area "A" functions as an etching stopper to prevent the underlying $SiO_2$ layer 325 from being etched.

A reactive ion etching process may be used instead, under the provision that the etching is carried out under a full over-etching condition to ensure no residue remaining on the stepped portions and the like of the region surrounding the memory cell area. Any residue would act as a mask during the later etching process, thereby causing the polysilicon layer 326 to remain at undesired sites.

Figure 7F:
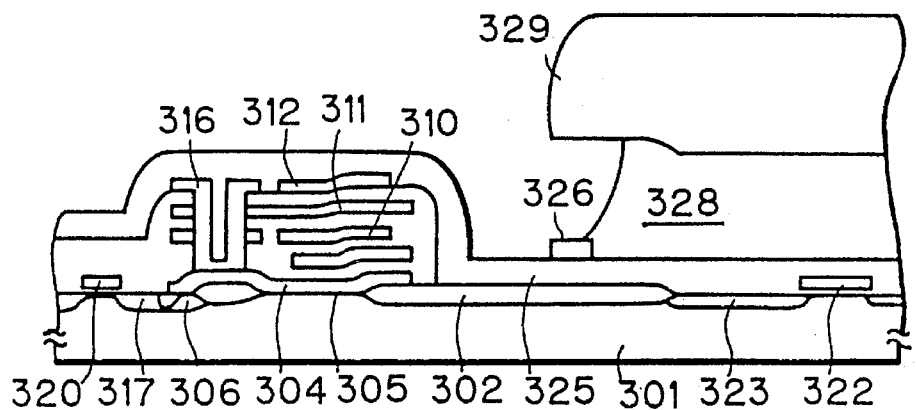

Step 6 (FIG. 7F)

Referring to FIG. 7F, a plasma etching process is carried out by using the resist pattern 329 as a mask to remove the polysilicon layer 326. A $CF_4/O_2$ gas mixture is advantageously used as an etching gas to prevent the $SiO_2$ layer 325 below the polysilicon layer 326 from being removed.

Figure 7G:
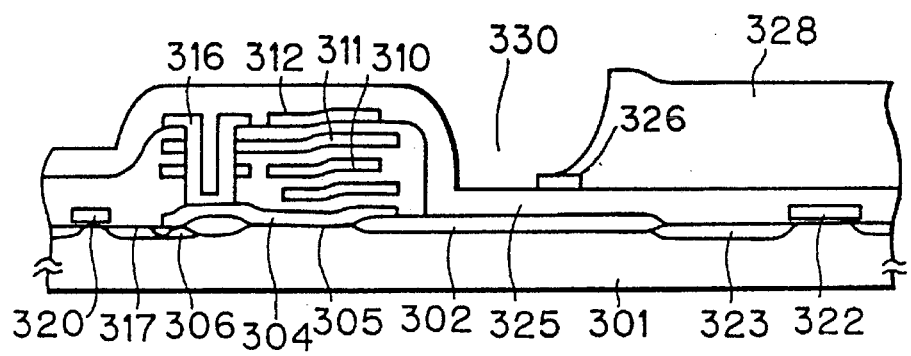

Step 7 (FIG. 7G)

The resist 329 is then exfoliated, as shown in FIG. 7G.

Figure 8:
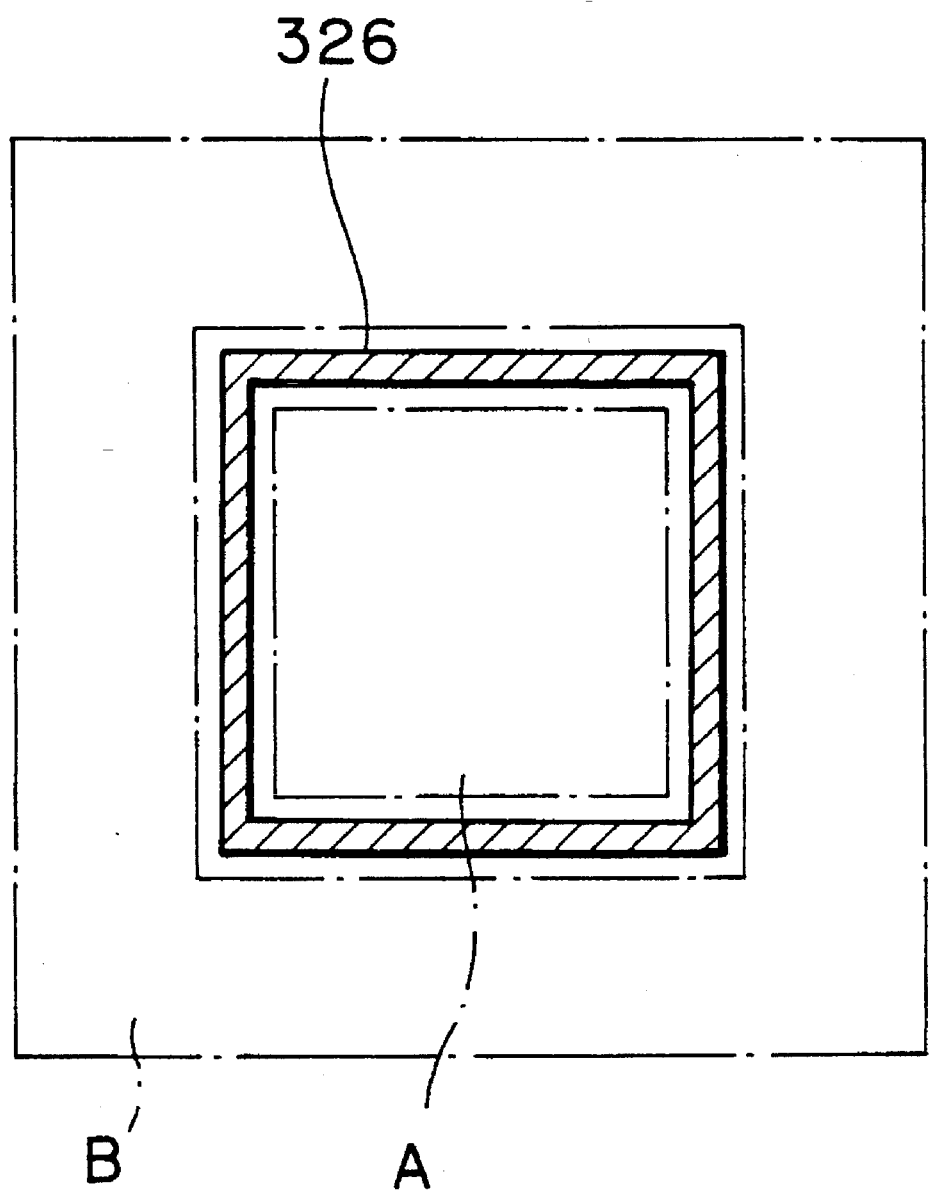
FIG. 8 shows an etching stopper layer retained around an SRAM region according to the present invention, in plan view.

In the boundary area "C", the polysilicon layer 326 remains below the end region of the BPSG layer 328, in the form of a belt zone surrounding the memory cell area "A"

as can be seen in FIG. 8, but does not cause adverse effects during the subsequent process steps.

The top surface of the SiO₂ layer 325 covering the memory cell area "A" is on the same level as the top surface of the BPSG layer 328 in the surrounding circuit area "B", but a full flattening has not yet been achieved at this stage, because concavities 330 are formed in the boundary area "C" between the memory cell area "A" and the surrounding circuit area "B" and in the memory cell area "A".

Figure 7H:
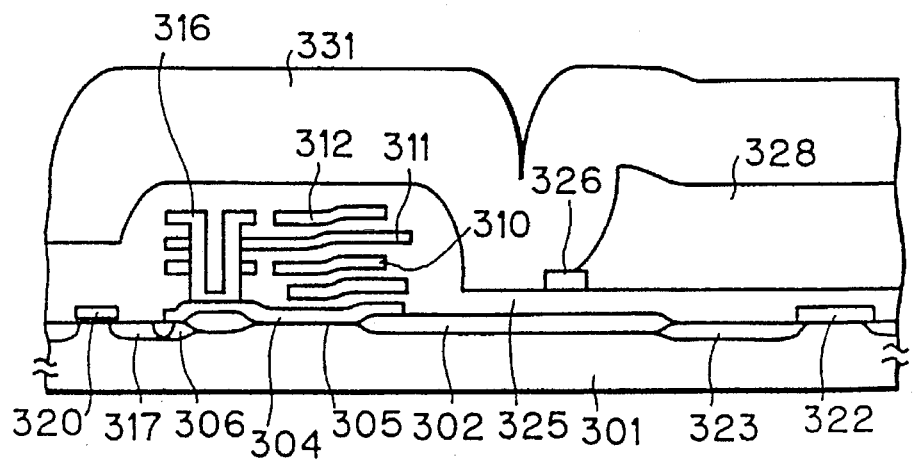
Figure 7I:
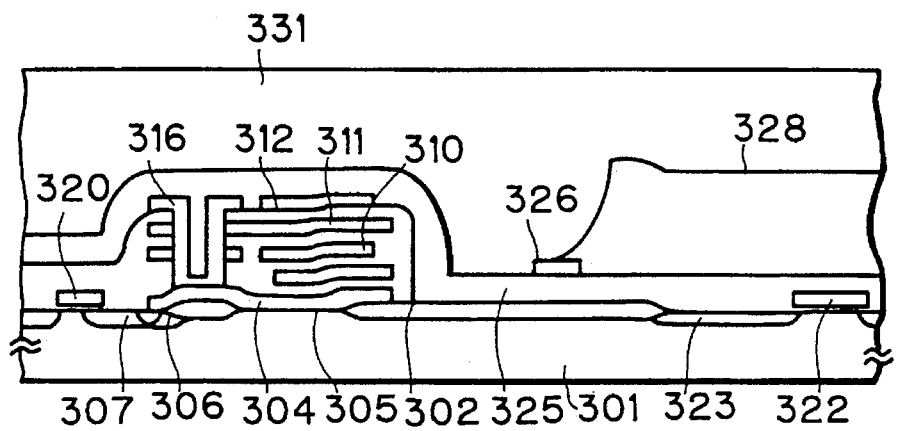

Steps 8 and 9 (FIGS. 7H and 7I)

A second BPSG layer 331 (400 nm thick) is formed by CVD process over the entire substrate 301 (FIG. 7H) and is then reflowed by a heat-treatment at 850° C. for 30 min to fill the concavities 330 with the second BPSG layer 331. This provides a full flattening of the second BPSG layer 331 as shown in FIG. 7I, i.e., no steps remain between the memory cell area "A" and the surrounding circuit 319.

Next step is to form a contact hole connecting wirings to the memory cell area "A" and the surrounding circuit 319.

Figure 7J:
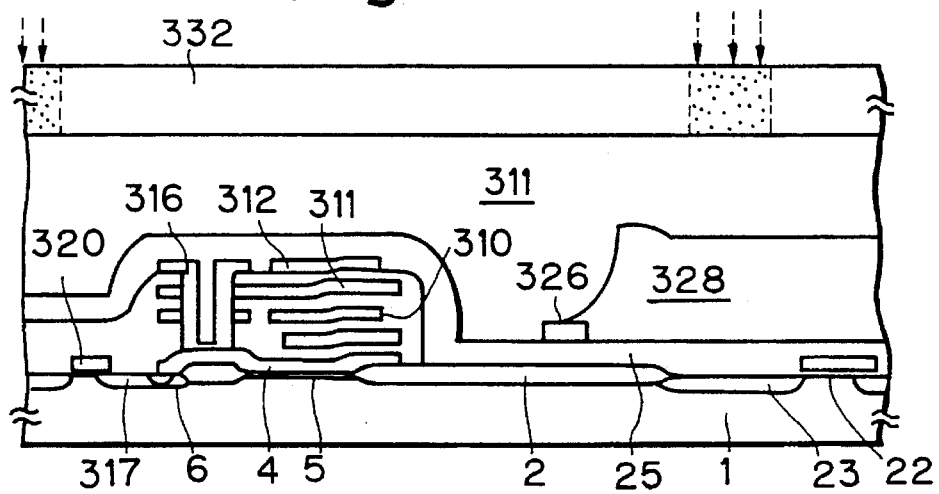

Step 30 (FIG. 7J)

To this end, a resist 332 is applied on the second BPSG layer 331, is exposed to light and is developed to form a mask pattern. Focus blooming does not occur during the exposure of the resist 332 and high precision patterning is achieved, because the second BPSG layer 331 has no unevenness or steps on the top surface thereof.

Figure 7K:
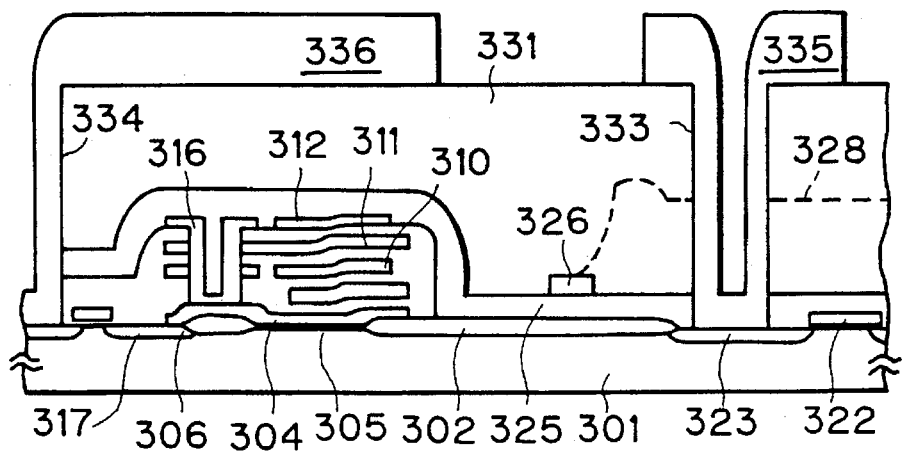

Step 11 (FIG. 7K)

The resist 332 is then used as a mask to open contact holes 333 and 334 through the BPSG layers 328 and 331 and the underlying SiO₂ layer 325 in the memory cell area "A" and the surrounding circuit 319. Metal conductor wirings 335 and 336 of tungsten are then formed through the contact holes 333 and 334.

Tungsten is difficult to wire-bond and has a higher resistivity than aluminum, particularly when forming long wiring. Therefore, a well-known two-layer metal wiring structure is then formed by coating entirely the substrate with an interwiring insulating layer of PSG (phosphosilicate glass) or the like, forming viaholes, and forming aluminum wirings.

The etching stopper layer 326 may be made of silicon nitride instead of polysilicon as used herein.

In this example, the etching stopper layer 326 is removed from the surrounding circuit 319 so as to only remain in the memory cell area "A" and the boundary area "C", as shown in FIG. 7C, for the following reason.

If the etching stopper layer 326 were also preserved on the surrounding circuit 319, the thus-preserved etching stopper layer 326 would be located under the BPSG layer 328 covering the surrounding circuit 319 and would remain in the final product.

Figure 9A:
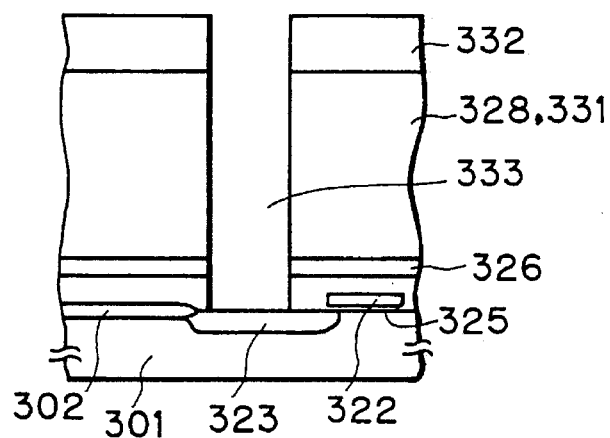
FIGS. 9A to 9C show a surrounding circuit area with an etching stopper layer unremoved, according to the present invention, in sectional view.

Then, to form a contact hole in the surrounding circuit 319, etching would be carried out by using the resist as a mask to remove the BPSG layers 328 and 331, the underlying etching stopper layer 326 and the further underlying SiO₂ layer 325, thereby forming a contact hole 333 with the underlying source/drain layer 323 exposed, as shown in FIG. 9A.

Figure 9B:
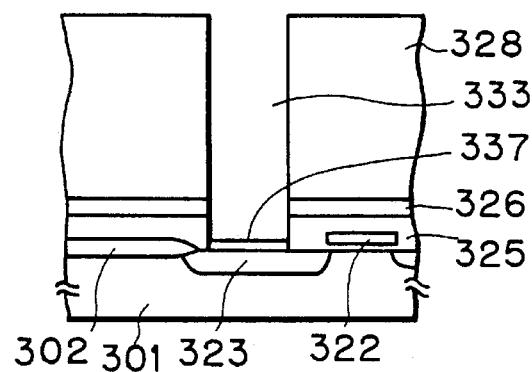
Figure 9C:
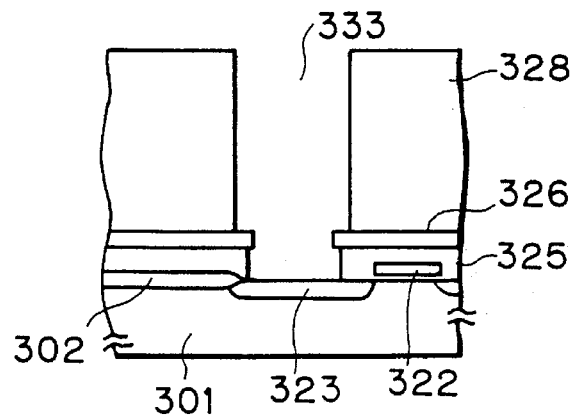

This etching would cause a natural oxide layer 337 to be formed on the surface of the source/drain region 323 as shown in FIG. 9B. Such a natural oxide layer must be removed by hydrofluoric acid. During this removal, the BPSG layers 328 and 331 and the SiO₂ layer 325 are etched in the transversal direction while the etching stopper layer 326, having a low etching rate, remains unetched and protrudes in the contact hole 333 as shown in FIG. 9C.

Sputtering of a wiring material into the contact hole 333, having such a protrusion, would cause incomplete coverage and lead to disconnection of the resulting wiring.

Therefore, the etching stopper layer 326 in the surrounding circuit 319 must be removed as shown in FIG. 7C to avoid the above-mentioned problem which would occur when the etching stopper is simply deposited.

Figure 3A:
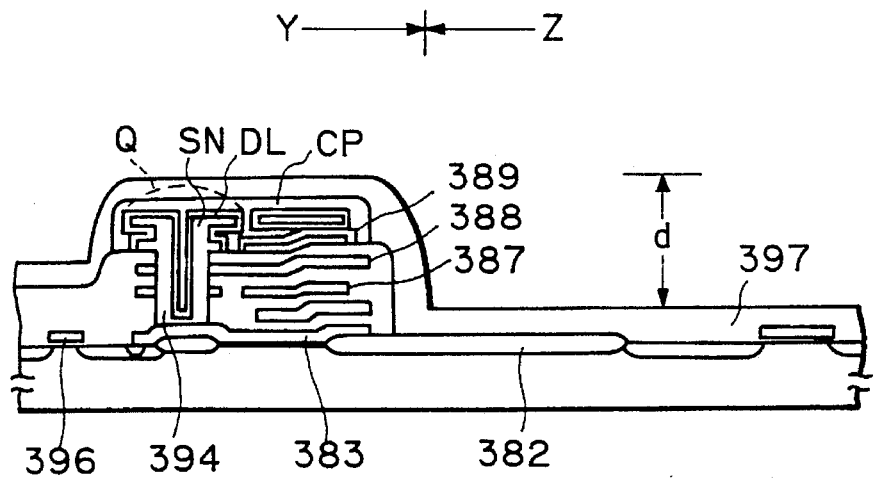
FIGS. 3A and 3B show another conventional arrangement of MOSFETs, in sectional view.
Figure 3B:
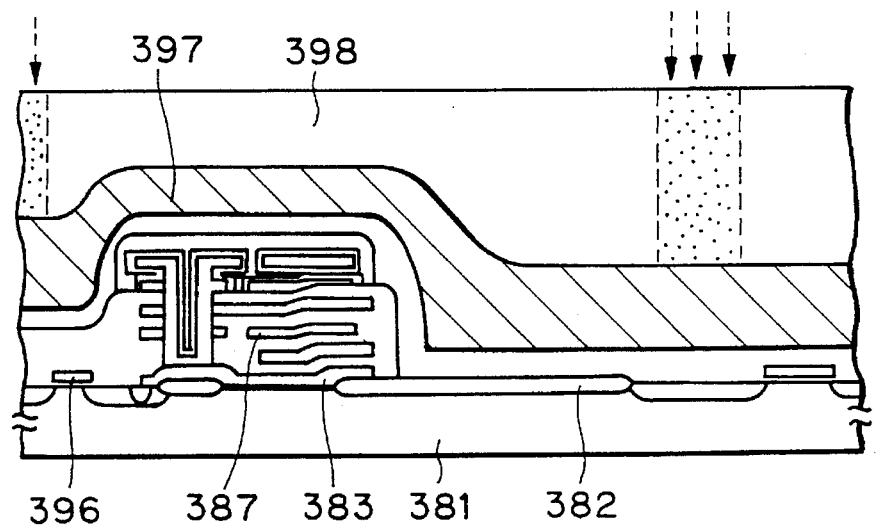
Figure 4A:
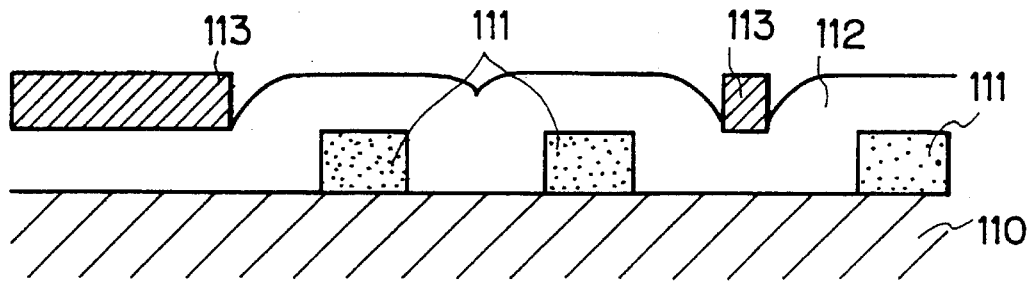
FIGS. 4A to 4C show the conventional process sequence, in sectional view.
Figure 4B:
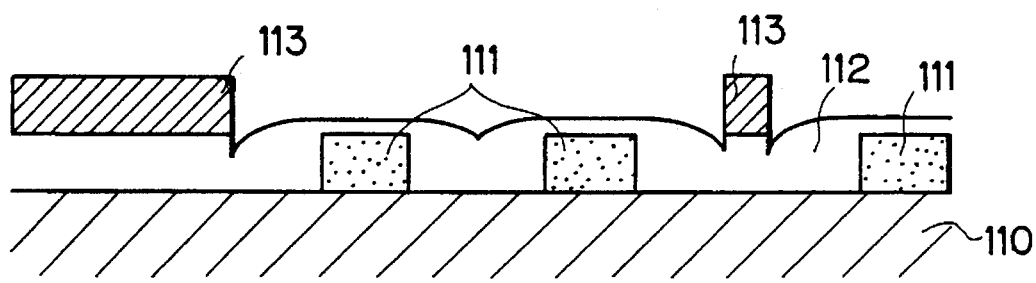
Figure 4C:
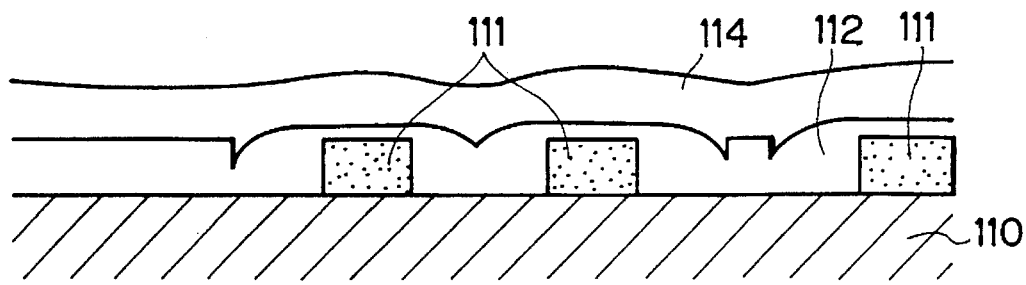

When an SRAM structure has a capacitor for eliminating the α-rays soft errors as shown in FIGS. 3A and 3B, the same result can be obtained by adopting the above-mentioned process steps from forming of the etching stopper layer 326 to depositing of the second BPSG layer 331.

As described above, the present invention forms a first insulating layer only on the surrounding circuit which is lower than the memory cell and deposits a second insulating layer on the first insulating layer and the memory cell, so that the surrounding circuit area has an increased height and is substantially as high as the memory cell. Moreover, the second insulating layer is formed on the memory cell area and the surrounding area to flatten these areas, so that a resist layer formed on the second insulating layer has a uniform thickness.

This advantageously improves the pattern precision by solving the problem of the focus depth encountered during forming of patterns running above and across these areas while being in contact with the underlying layer.

The etching stopper layer is present in the form of a belt and only in the boundary area, so that the etching stopper layer does not transversely protrude in throughholes, and thereby, shape defects do not occur.

During removal of the first insulation layer in the memory cell area, the etching stopper layer, which is present just below the region to be removed, prevents excessive etching of the underlying layers.

The present invention provides a semiconductor device, such as DRAMs and SRAMs, with a sufficient flattening for ensuring high precision patterning of wirings running over and across the memory cell area and the surrounding circuit area having a large step or height difference therebetween. The height difference between these areas is thus eliminated to ensure the forming of fine patterns. The Q-rays soft errors are prevented by an increased memory cell capacity, so that high speed operation is fully achieved in contrast to the conventional art in which ECC is used for the same purpose.

We claim:

1. A semiconductor device comprising:

a semiconductor substrate having a memory cell area containing a plurality of memory cells and a circuit area surrounding the memory cell area with a boundary area interposed therebetween;

a first conductive layer covering the memory cell area and having an extended portion extending onto the boundary area;

a first insulating layer covering the circuit area surrounding the memory cell area and covering part of the extended portion of the first conductive layer, the first insulating layer having a pattern edge on the first conductive layer and having an etching rate different than an etching rate of said first conductive layer;

a second insulating layer covering the first insulating layer and the first conductive layer;

a throughhole formed through the first and second insulating layers; and a second conductive layer electrically connected with another conductive layer via the throughhole and extending from the memory cell area to the circuit area surrounding the memory cell area.

2. A semiconductor device according to claim 1, wherein the memory cell area has a height; the circuit area has a height; and the first insulating layer has a thickness corresponding to a difference between heights of the memory cell area and the circuit area.

3. A semiconductor device according to claim 2, further comprising a third insulating layer disposed on the first conductive layer, said third insulating layer exhibiting an etching property different from those of the first and second insulating layers.

4. A semiconductor device according to claim 3, wherein the first and second insulating layers contain impurities and have been reflowed.

5. A semiconductor device according to claim 2, wherein the first and second insulating layers contain impurities and have been reflowed.

6. A semiconductor device according to claim 1, wherein the memory cell is composed of a transfer transistor and a capacitor, one of electrodes of the capacitor being composed of the first conductive layer.

7. A semiconductor device according to claim 6, wherein the first and second insulating layers contain impurities and have been reflowed.

8. A semiconductor device according to claim 1 wherein the first and second insulating layers contain impurities and have been reflowed.

9. A semiconductor device comprising:

a semiconductor substrate;

a memory cell area containing a plurality of memory cells and a surrounding area having an uppermost surface located on a level lower than an uppermost surface of the memory cell area;

a band pattern layer located on a level lower than the uppermost surface of the memory cell area and disposed on a boundary area between the memory cell area and the surrounding area;

first insulating layer formed on the uppermost surface of the surrounding area and covering a periphery of the boundary area, the first insulating layer having a pattern edge on the periphery of the boundary area; and a second insulating layer entirely covering the first insulating layer, the memory cell area and the boundary area.

10. A semiconductor device according to claim 9, wherein the band pattern layer is composed of polysilicon or silicon nitride; and the first and second insulating layers are composed of a silicon oxide layer containing impurities.

11. A semiconductor device according to claim 9, wherein the memory cell area includes a pattern of conductive layers composed of a plurality of layers; and the surrounding area includes a pattern of conductive layers less in number than that of the memory cell area.

* * * * *